(12) United States Patent
Liu

(10) Patent No.: US 8,167,466 B2
(45) Date of Patent: May 1, 2012

(54) LED ILLUMINATION DEVICE AND LAMP UNIT THEREOF

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 380 days.

(21) Appl. No.: 12/478,773

(22) Filed: Jun. 5, 2009

(65) Prior Publication Data

US 2010/0172133 A1    Jul. 8, 2010

(30) Foreign Application Priority Data

Jan. 6, 2009    (CN) .......................... 2009 1 0300076

(51) Int. Cl.
   *F21V 29/00*    (2006.01)
(52) U.S. Cl. .......................... 362/373; 362/294; 362/218
(58) Field of Classification Search .................. 362/294, 362/373, 345, 264, 218, 126, 547, 580, 800, 362/249.02
   See application file for complete search history.

(56) References Cited

U.S. PATENT DOCUMENTS

| | | | | |
|---|---|---|---|---|
| 4,613,931 A * | 9/1986 | Messinger | ..................... | 362/373 |
| 7,461,951 B2 * | 12/2008 | Chou et al. | ..................... | 362/294 |
| 7,637,636 B2 * | 12/2009 | Zheng et al. | ..................... | 362/294 |
| 7,815,338 B2 * | 10/2010 | Siemiet et al. | ................. | 362/218 |
| 7,815,347 B2 * | 10/2010 | Lin et al. | ......................... | 362/373 |
| 7,854,534 B2 * | 12/2010 | Liu | ................................ | 362/294 |
| 7,918,580 B2 * | 4/2011 | Liu | ................................ | 362/218 |
| 2004/0037081 A1 * | 2/2004 | Blandford | ..................... | 362/283 |
| 2005/0201098 A1 * | 9/2005 | DiPenti et al. | ................. | 362/294 |
| 2007/0189012 A1 * | 8/2007 | Huang et al. | .................. | 362/294 |
| 2009/0116233 A1 * | 5/2009 | Zheng et al. | .................. | 362/234 |
| 2009/0185379 A1 * | 7/2009 | Chen | ............................ | 362/294 |
| 2009/0262543 A1 | 10/2009 | Ho | | |
| 2010/0020542 A1 * | 1/2010 | Teng et al. | ............... | 362/249.05 |
| 2010/0027263 A1 * | 2/2010 | Wang | ...................... | 362/249.06 |
| 2010/0027266 A1 * | 2/2010 | Tsai et al. | ..................... | 362/267 |

FOREIGN PATENT DOCUMENTS

| | | |
|---|---|---|
| CN | 1779321 A | 5/2006 |
| TW | 200743232 A | 11/2007 |
| TW | M323021 U | 12/2007 |
| TW | M332166 U | 5/2008 |
| TW | M343111 U | 10/2008 |

\* cited by examiner

*Primary Examiner* — Bao Q Truong
(74) *Attorney, Agent, or Firm* — Altis Law Group, Inc.

(57) ABSTRACT

An LED illumination device includes a lampshade, and a plurality of lamp units mounted on the lampshade. Each lamp unit includes a light-emitting module having a plurality of light sources and a heat sink arranged above the light-emitting module. The heat sink includes an elongated base and a plurality of fins on the base. The base has an outer convex surface formed at a top side thereof and an opposite inner concave surface formed at a bottom side thereof. The fins extend outwardly from the convex surface of the base. The concave surface defines an elongated recess extending along an axial direction of the base. Two opposite free ends of the base are spaced from each other and cooperatively define a light emitting window below the concave surface. The light sources are received in the recess and thermally attached to the concave surface.

18 Claims, 10 Drawing Sheets

LED ILLUMINATION DEVICE AND LAMP UNIT THEREOF

CROSS-REFERENCE TO RELATED APPLICATION

This application is related to a co-pending U.S. patent application entitled "LED ILLUMINATING DEVICE AND LAMP UNIT THEREOF" Ser. No. 12/478,772 and filed in the same day as the instant application. The co-pending U.S. patent application is assigned to the same assignee as the instant application. The disclosures of the above-identified application are incorporated herein by reference.

BACKGROUND

1. Technical Field

The present disclosure relates to light emitting diode (LED) illumination device, and particularly to an LED illumination device and a lamp unit thereof with high heat dissipating efficiency and wide illumination area.

2. Description of Related Art

In recent years, LEDs are preferred for use in illumination devices rather than CCFLs (cold cathode fluorescent lamps) due to their excellent properties, including high brightness, long lifespan, wide color range, and etc.

For an LED, about eighty percents of the power consumed thereby is converted into heat. Generally, the illumination device includes a plurality of LEDs and the LEDs are arranged on a flat surface whereby an illumination area of the LEDs is limited. Thus, the illumination device cannot obtain a desired illumination area. In addition, heat dissipation of the LED illumination device is a problem inhibiting the application of the LED illumination device, which requires to be resolved.

For the foregoing reasons, therefore, there is a need in the art for an LED illumination device which overcomes the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
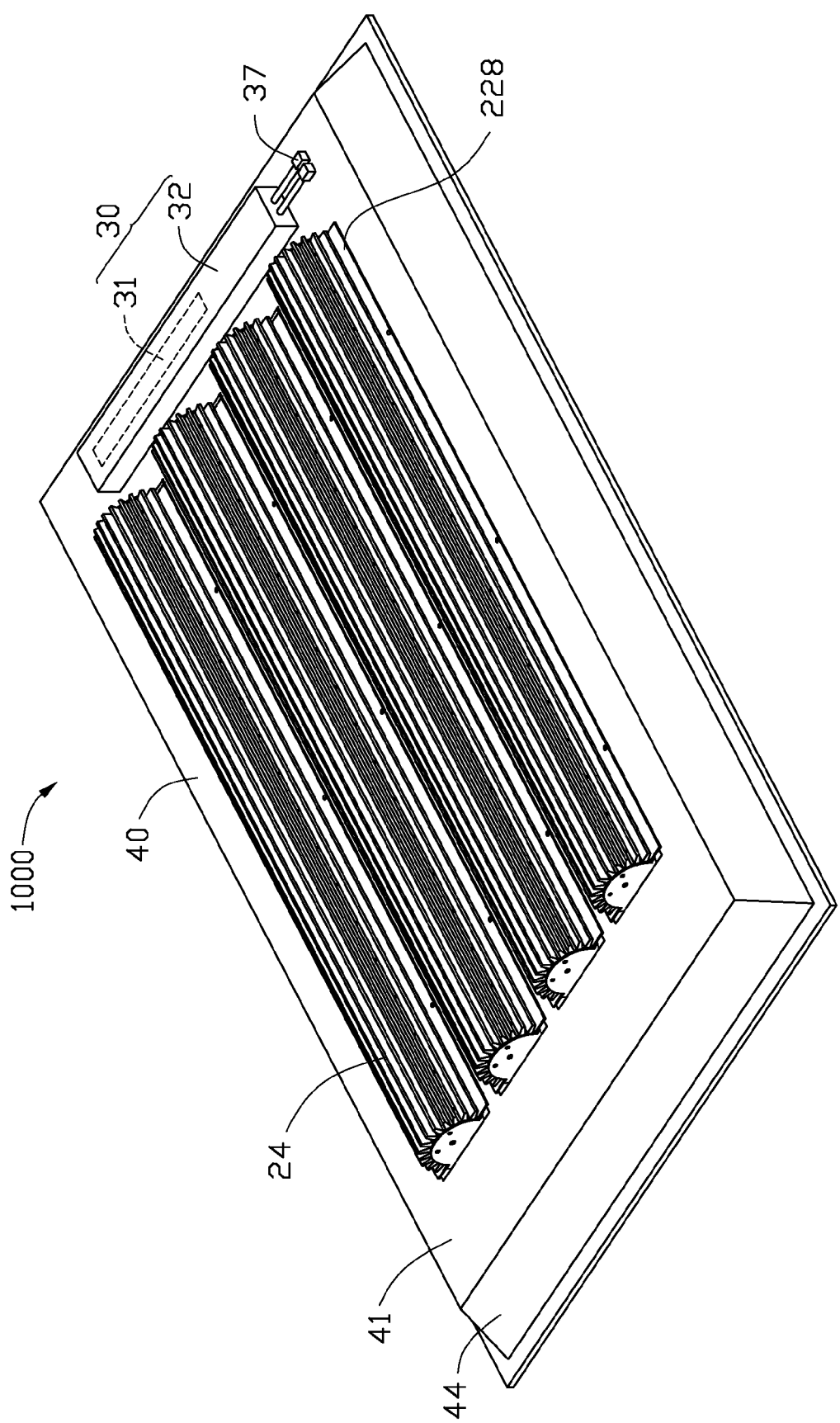
FIG. 1 is an isometric, assembled view of an LED illumination device according to a first embodiment.
Figure 2:
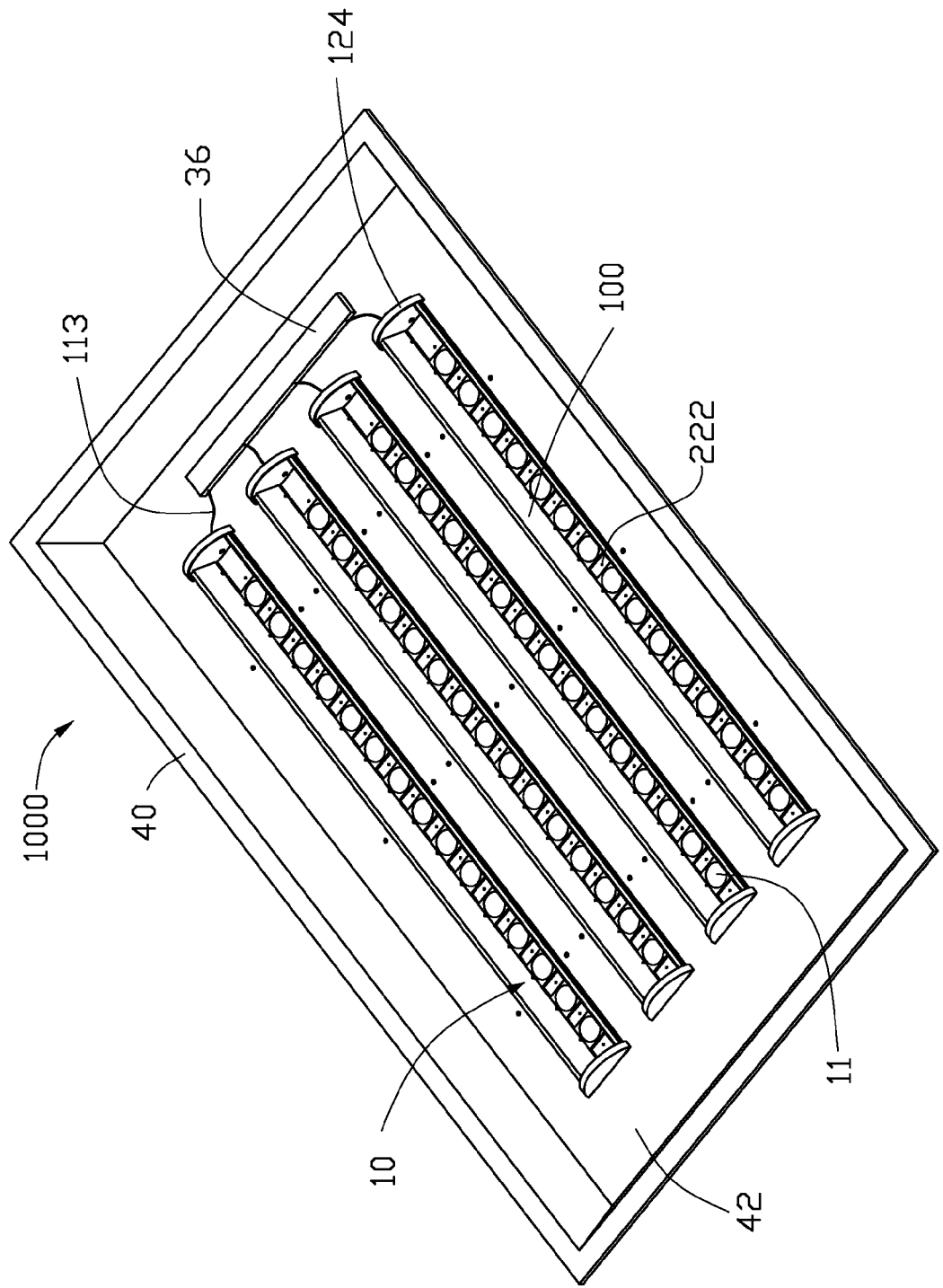
FIG. 2 shows the LED illumination device of FIG. 1, but viewed from another viewpoint, with light penetrable covers thereof removed.

Referring to FIGS. 1-2, an LED illumination device 1000 according to a first embodiment includes a lampshade 40, a plurality of lamp units 100 and an electrical module 30 mounted on the lampshade 40. The lamp units 100 are identical to each other, and are arranged parallel to each other.

Figure 3:
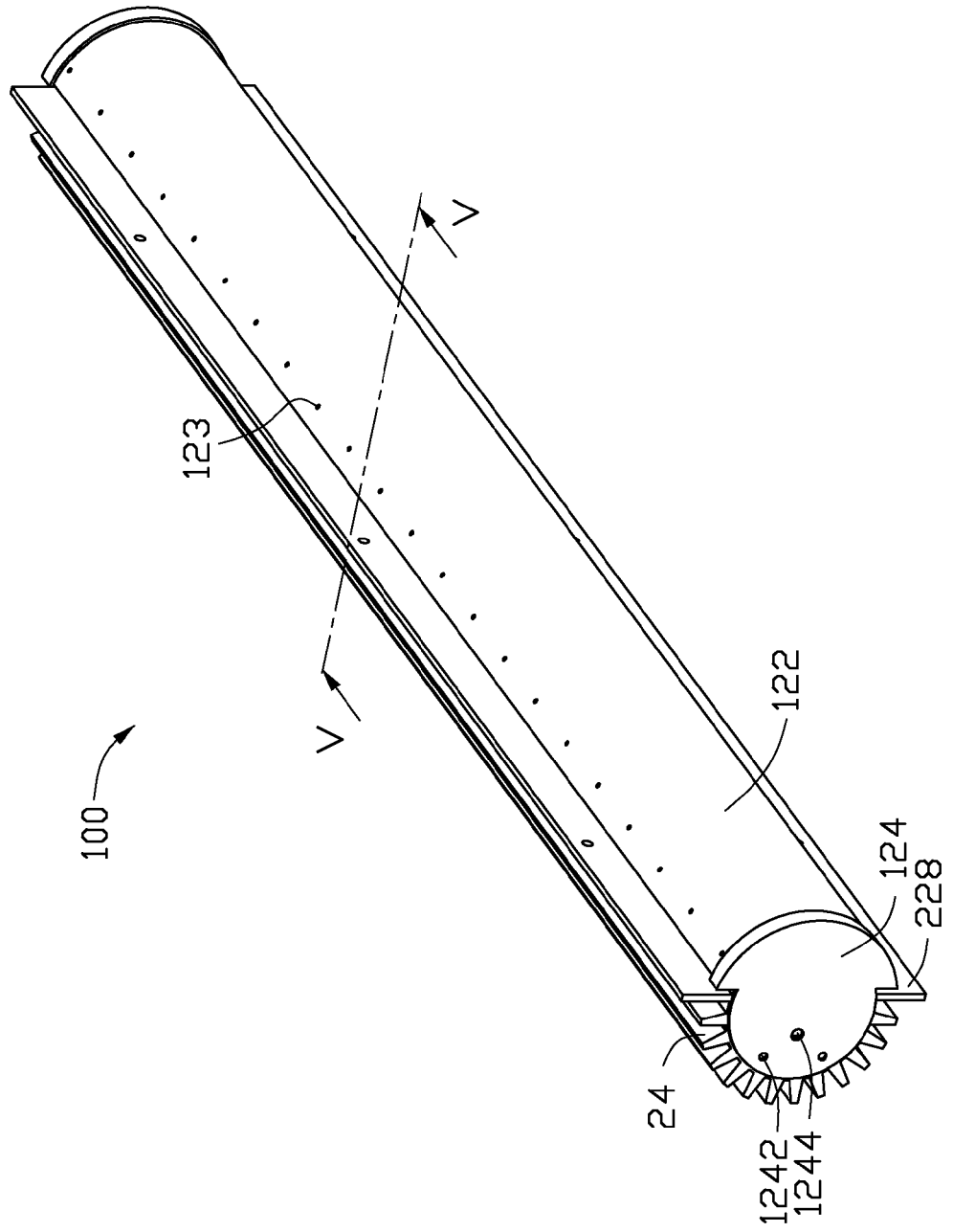
FIG. 3 is an isometric, assembled view of a lamp unit of the LED illumination device of FIG. 1.
Figure 4:
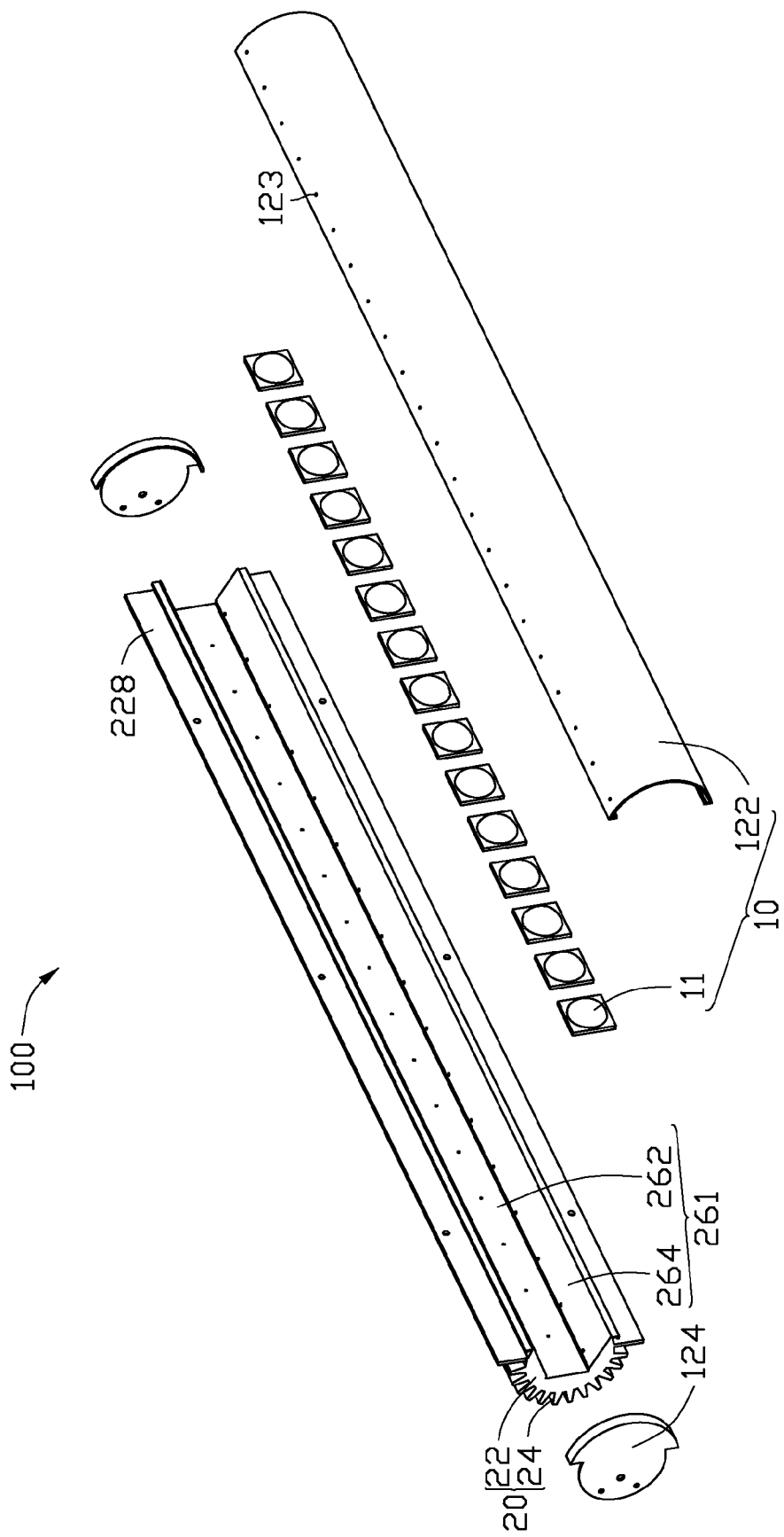
FIG. 4 is an isometric, exploded view of the lamp unit of FIG. 3.
Figure 5:
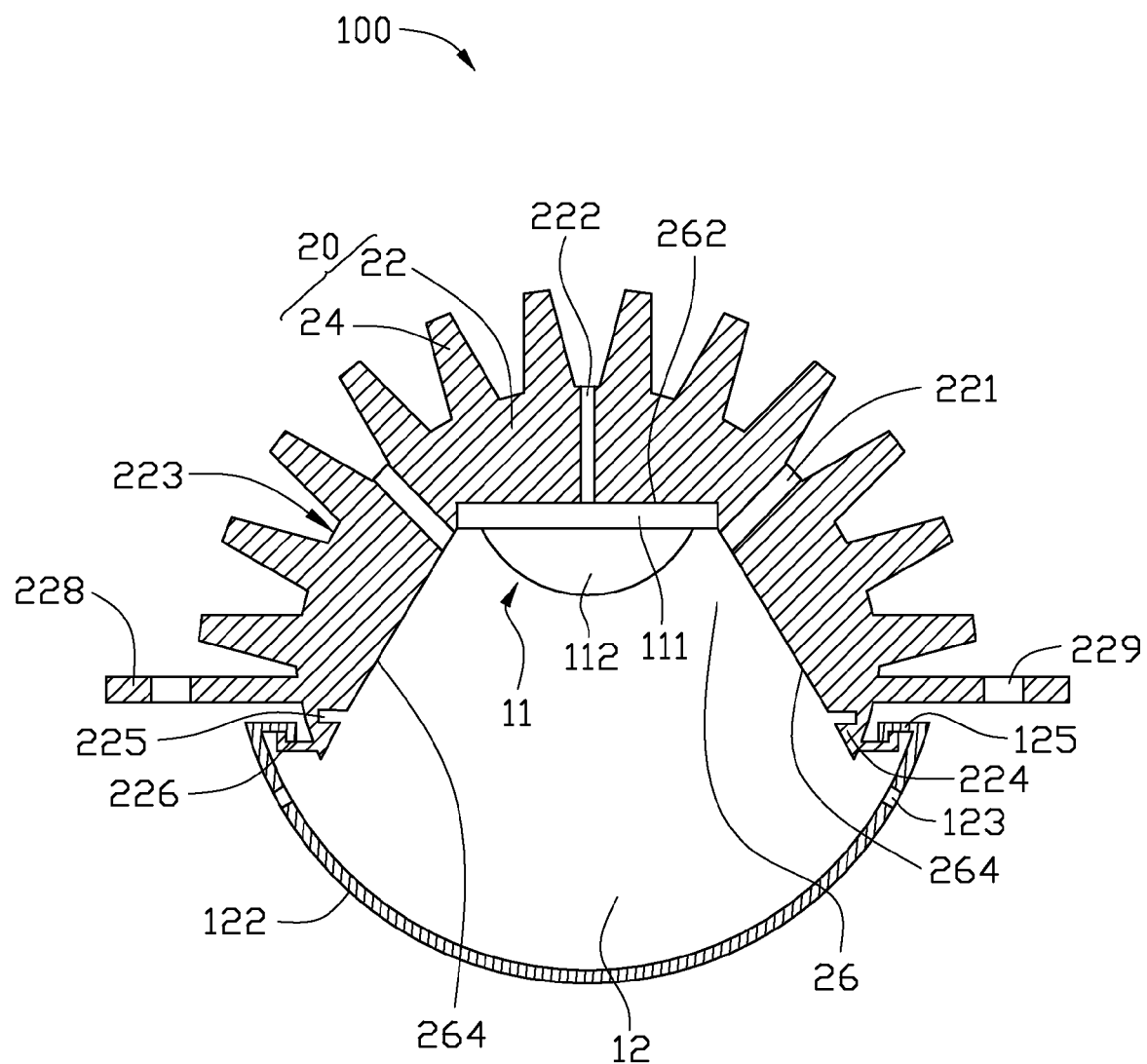
FIG. 5 is a cross-sectional view of the lamp unit of FIG. 3, taken along line V-V thereof.

Referring to FIGS. 3-5, the lamp unit 100 includes a light-emitting module 10 and a heat sink 20 arranged above the light-emitting module 10. The light-emitting module 10 is electrically connected with the electrical module 30.

The heat sink 20 includes an elongated metal base 22 and a plurality of metal fins 24 extending from the base 22. The base 22 is substantially semicircle-shaped and defines an elongated recess 26 therein along an axial direction thereof, to thereby form an outer semicircular convex surface 223 at a top side thereof, and an opposite inner concave surface 261 at a bottom side thereof, which has a profile of a top and two lateral sides of an isosceles trapezoid. The fins 24 extend radially and outwardly from the convex surface 223 of the base 22 and have a uniform extending height. Upper free ends of the fins 24 cooperatively form an imaginary semicircular, convex surface.

The concave surface 261 includes a horizontal first plane 262 at a top thereof, and two sloping second planes 264 located below and at two opposite lateral sides of the first plane 262. The two second planes 264 extend outwardly and downwardly from the two opposite lateral sides of the first plane 262 and intersect with the convex surface 223 at two opposite lateral sides 224 of the base 22, respectively. The first plane 262 and the two second planes 264 cooperatively define the elongated recess 26 of the base 22. A transverse cross section of the elongated recess 26 is substantially isosceles trapezoid. A horizontal distance between the two second planes 264 increases from the first plane 262 along a downward direction.

The two opposite lateral sides 224 of the base 22 are spaced from each other and cooperatively define a light emitting window therebetween, which is below the concave surface 261. Each of the two opposite lateral sides 224 forms a bracket 226 and a mounting flange 228 on the convex surface 223 thereof. The bracket 226 extends horizontally and outwardly from the convex surface 223, and then upwardly towards the fins 24. The mounting flange 228 is located above the bracket 226, and extends horizontally and outwardly from the convex surface 223. A plurality of mounting apertures 229 are defined in the mounting flange 228 for mounting the lamp unit 100 to the lampshade 40. Further, each of the two opposite lateral sides 224 defines a latching groove 225 in the second plane 264 thereof.

The light-emitting module 10 includes a plurality of light sources 11 and a light penetrable cover 122. The light sources 11 are received in the elongated recess 26 of the base 22 of the heat sink 20, and attached to the first plane 262 of the concave surface 261 of the base 22. The light sources 11 are evenly spaced from each other along the axial direction of the base 22. The heat sink 20 and the light sources 11 are assembled together to form a light engine for the lamp unit 100. The first plane 262 of the concave surface 261 of the base 22 functions as a heat-absorbing surface for the light sources 11, and the convex surface 223 of the base 22 functions as a heat-spreading surface for the light sources 11.

Each light source 11 includes a rectangular substrate 111 forming electrical circuits thereon, and at least one LED 112

(light emitting diode) arranged on the substrate 111 and electrically connected to the electrical circuits. A pair of electrodes are provided at two opposite ends of the substrate 111. The LED 112 is electrically connected to the electrodes. When the light sources 11 are mounted to the first plane 262 of the base 22, a layer of thermal interface material (TIM) may be applied between the substrate 111 of each light source 11 and the first plane 262 of the base 22 to eliminate an air interstice therebetween, to thereby enhance a heat conduction efficiency between the light sources 11 and the base 22. Alternatively, the substrate 111 of each light source 11 can be attached to the first plane 262 of the base 22 fixedly and intimately through surface mount technology (SMT). Electrical circuits formed on the substrate 111 can be directly formed on the first plane 262 of the base 22, and the LED 112 is directly attached to the electrical circuits of the first plane 262 of the base 22, whereby the substrate 111 can be omitted and a heat resistance between the LED 112 and the base 22 is reduced.

The light penetrable cover 122 is located below the light sources 11 and mounted to the base 22 of the heat sink 20. The light penetrable cover 122 functions as an optical lens for the LEDs 112 of the light sources 11. Light emitted by the LEDs 112 of the light sources 11 is guided to environment by the light penetrable cover 122. The light penetrable cover 122 is substantially C-shaped and forms two securing portions 125 at two opposite lateral sides thereof corresponding to the brackets 226 of the base 22. Each securing portion 125 extends horizontally and inwardly from a corresponding lateral side of the light penetrable cover 122. The light penetrable cover 122 is mounted to the heat sink 20 via an engagement between the securing portions 125 and the brackets 226. Alternatively, the light penetrable cover 122 can be mounted to the heat sink 20 by inserting two lateral sides of the light penetrable cover 122 in the latching grooves 225 of the base 22 when the two lateral sides of the light penetrable cover 122 are horizontally and outward extended. The light penetrable cover 122 and the concave surface 261 of the base 22 cooperatively define a chamber 12 with two opposite axial ends thereof being open. Two end covers 124 are mounted to two opposite axial ends of the heat sink 20 and cover the two open axial ends of the chamber 12, respectively. Each end cover 124 defines a plurality of mounting holes 1242 therein for screws extending therethrough to mount the end cover 124 to the heat sink 20. Each end cover 124 further defines a wire hole 1244 therein for electrical wires 113 of the light sources 11 (FIG. 2) extending therethrough.

In operation of the lamp unit 100, a large amount of heat is generated by the LEDs 112 of the light sources 11. As the light sources 11 are attached to the heat sink 20, the heat generated by the LEDs 112 can be conducted not only to the fins 24 above the light sources 11 for dissipation via a first portion of the base 22 which connected with the light sources 11, but also to two lateral second portions of the base 22 which connected two opposite lateral sides of the first portion of the base 22 and to the fins 24 formed on the second portions of the base 22 via the first portion of the base 22. The heat of the LEDs 112 is removed timely and effectively by the heat sink 20. Thus, the LEDs 112 can be kept working at a lower temperature, and the brightness, lifespan, and reliability of the lamp unit 100 will be improved. At the same time, as the light sources 11 are attached to the first plane 262 of the concave surface 261 of the base 22, the two second planes 264 beside the first plane 262 cooperatively function as a light reflector to amplify the light illumination of the lamp unit 100. Light emitted by the LEDs 112 is reflected and guided by the two second planes 264 to outside objects through the light penetrable cover 122, so that the lamp unit 100 can illuminate a desired large area.

In order to further improve the heat dissipating efficiency of the lamp unit 100, the base 22 of the heat sink 20 defines a plurality of first air exchanging holes 221 through the convex surface 223 and the two second planes 264 of the concave surface 261 and a plurality of second air exchanging holes 222 through the convex surface 223 and the first plane 262 of the concave surface 261. The light penetrable cover 122 defines a plurality of air venting holes 123 therein. The first air exchanging holes 221 are located adjacent to two lateral sides of the first plane 262 and evenly spaced from each other along the base 22. The second air exchanging holes 222 are evenly spaced from each other along the base 22 and each located between two adjacent LEDs 112 (also referring to FIG. 2). The air venting holes 123 are located adjacent to two opposite lateral sides of the light penetrable cover 122 and evenly spaced from each other along the light penetrable cover 122. Air in the chamber 12 is heated by the heat of the LEDs 112, and than floats upwardly. The heated, upwardly floating air escapes to ambient atmosphere via the first and the second exchanging holes 221, 222 defined in the base 22 of the heat sink 20. Cooling air in the ambient atmosphere enters into the chamber 12 via the air venting holes 123 defined in the light penetrable cover 122, whereby a natural air convection is circulated between the chamber 12 and the ambient atmosphere. The two second planes 264 of the base 22 continuously exchange heat with the air flowing through the chamber 12, which greatly improves the heat dissipating effectiveness of the heat sink 20.

Figure 6:
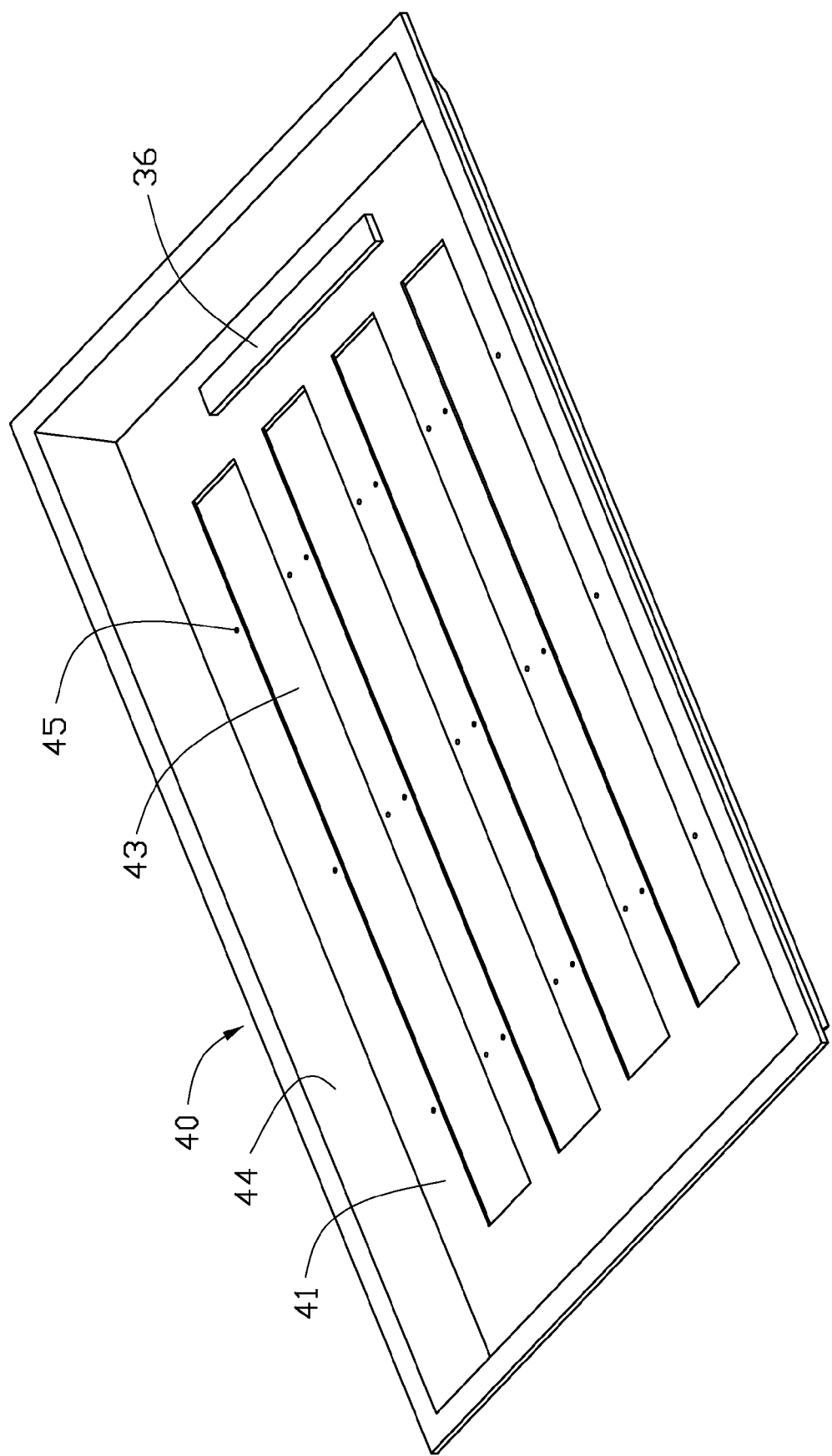
FIG. 6 is an isometric view of a lampshade of the LED illumination device of FIG. 2.

Referring to the FIGS. 1-2 and 6, the lampshade 40 includes a top mounting plate 41 and a sidewall 44 extending downwardly from a periphery of the mounting plate 41. The mounting plate 41 is substantially rectangular. The sidewall 44 expands slightly outwardly from the periphery of the mounting plate 41. The lampshade 40 defines a receiving space 42 therein for accommodating the light-emitting module 10 of each lamp unit 100 therein. The receiving space 42 is surrounded by the sidewall 44 and the mounting plate 41. A plurality of elongated openings 43 are defined in the mounting plate 41 for mounting the lamp units 100 on the mounting plate 41. The openings 43 are parallel to and spaced from each other, and communicate with the receiving space 42. A size of the opening 43 of the mounting plate 41 is slightly larger than the light penetrable cover 122 and smaller than the heat sink 20. A plurality of mounting holes 45 are defined in the mounting plate 41 at two opposite lateral sides of each opening 43 corresponding to the mounting apertures 229 of the mounting flange 228 of the heat sink 20 for mounting a corresponding lamp unit 100 to the mounting plate 41.

A wire box 36 is mounted on an inner surface the mounting plate 41 and is received in the receiving space 42. The electrical module 30 is mounted on an outer surface of the mounting plate 41. The electrical module 30 includes a protecting cover 32 and a circuit board 31 received in the protecting cover 32. The protecting cover 32 protects the circuit board 31 from an outer environment. The protecting cover 32 and the wire box 36 are located at one end of the mounting plate 41. The light sources 11 of each lamp unit 100 are electrically connected with the circuit board 31 via the electrical wires 113. The electrical wires 113 of the light sources 11 are together connected to the wire box 36 and then electrically connected with the circuit board 31. A plug 37 extends outwardly from the protecting cover 32 for connecting the circuit board 31 to an external power source. Cooperatively, the wire box 36 and the electrical module 30 provide drive power, control circuit and power management for the light sources 11 of each lamp unit 100.

When assembled, fixing devices, such as screws, extend through the mounting apertures 229 of the heat sink 20 and the mounting holes 45 of the mounting plate 41 to assemble the lamp units 100 in the corresponding openings 43 of the lampshade 40 to form the LED illumination device 1000. The light sources 11 of each lamp unit 100 are received at the corresponding opening 43 of the lampshade 40, the base 22 of the heat sink 20 is located in the corresponding opening 43 with the mounting flanges 228 of the heat sink 20 abutting against the mounting plate 41 beside the corresponding opening 43, and the fins 24 of the heat sink 20 are located above the mounting plate 41 of the lampshade 40.

During operation, the light sources 11 are connected to the wire box 36 through the electrical wires 113, whereby the external power source can supply electric current to the LEDs 112 through the circuit board 31 and the wire box 36 to cause the LEDs 112 to emit light. The light of the LEDs 112 travels through the lampshade 40 to outside for lighting. The illumination capability the LED illumination device 1000 is enhanced by mounting a plurality of lamp units 100 on the lampshade 40.

Figure 7:
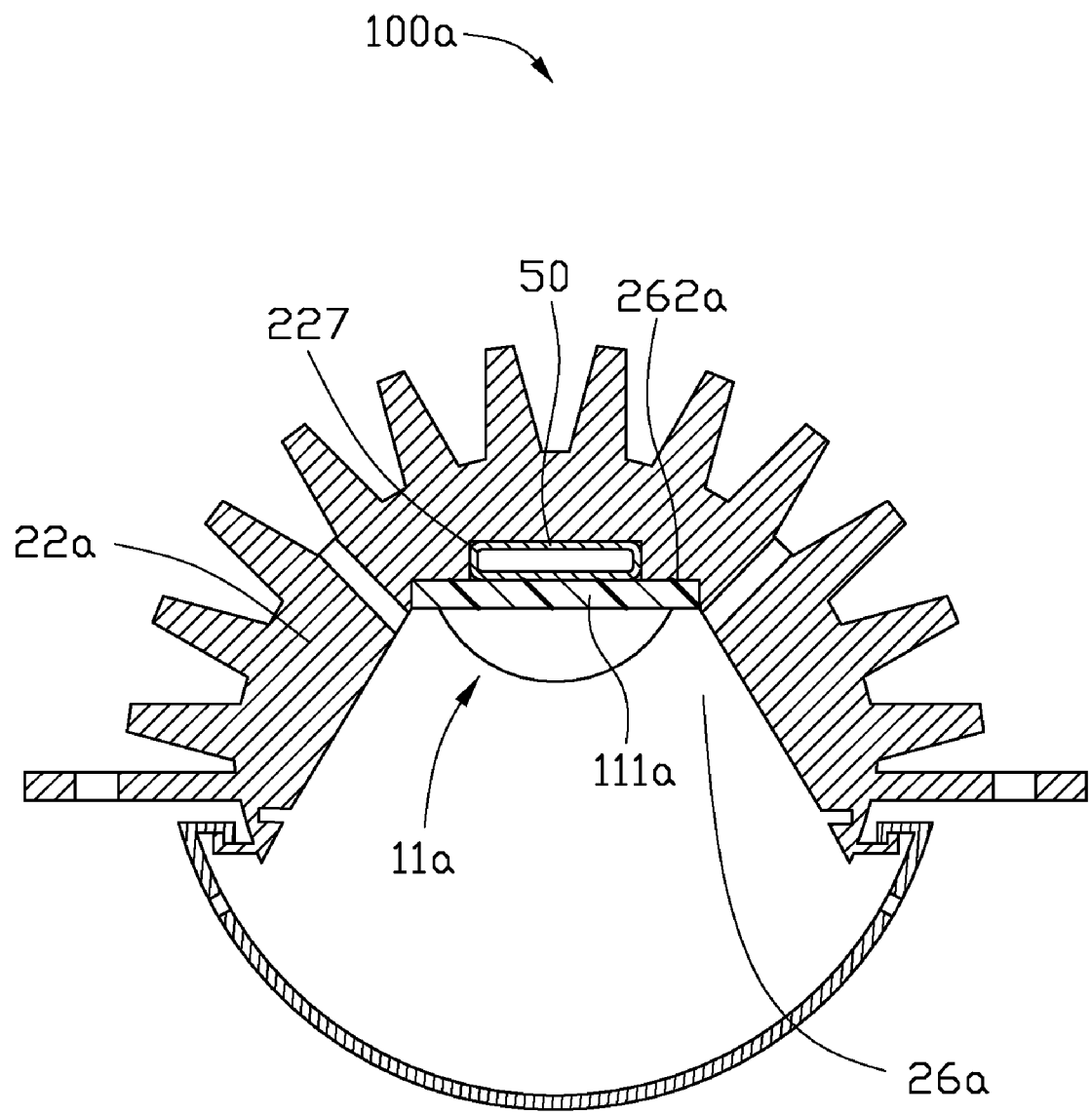
FIG. 7 is a cross-sectional view of a lamp unit of an LED illumination device according to a second embodiment.

Referring to FIG. 7, a lamp unit 100a of an LED illumination device according to a second embodiment is illustrated. Except the following differences, the lamp unit 100a of the present embodiment is essentially the same as the lamp unit 100 of the previous embodiment. In the present embodiment, a base 22a of a heat sink the lamp unit 100a defines axially an elongated groove 227 in a horizontal first plane 262a of a bottom thereof. Light sources 11a are received in an elongated recess 26a defined in the bottom of the base 22a and each have a substrate 111a attached to the first plane 262a. A flat heat pipe 50 is received in the groove 227 and sandwiched between the base 22a and the light sources 11a to transfer heat of the light sources 11a to the base 22a. The heat pipe 50 is well known due to its excellent heat transfer performance. The heat pipe 50 has a low thermal resistance in heat transfer due to a phase change mechanism of working fluid employed in the heat pipe 50, which improves the heat conduction efficiency between the light sources 11a and the base 22a.

Figure 8:
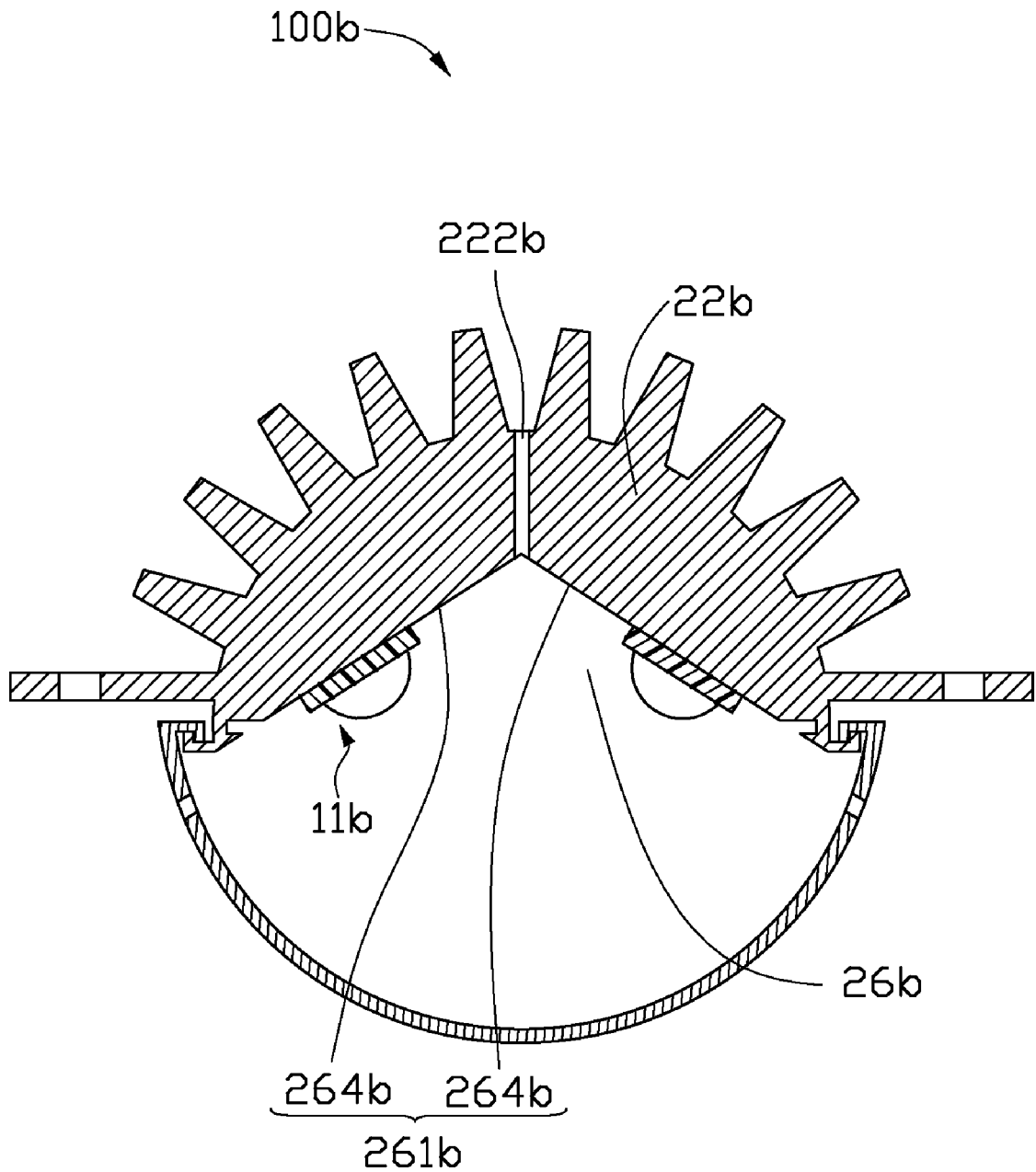
FIG. 8 is a cross-sectional view of a lamp unit of an LED illumination device according to a third embodiment.

Referring to FIG. 8, a lamp unit 100b of an LED illumination device according to a third embodiment is illustrated. Except the following differences, the lamp unit 100b of the present embodiment is essentially the same as the lamp unit 100 of the previous embodiment. In the present embodiment, a base 22b of a heat sink the lamp unit 100b forms substantially a V-shaped concave surface 261b at a bottom side thereof. The concave surface 261b is constructed by two intersecting sloping planes 264b. Light sources 11b are received in an elongated recess 26b defined in the bottom side of the base 22b and symmetrically attached to the two sloping planes 264b. Each of the two sloping planes 264b of the base 22b function as a heat-absorbing surface for the light sources 11b. The base 22b defines a plurality of exchanging holes 222b through the base 22b at a joint of the two sloping planes 264b of the concave surface 261b.

Figure 9:
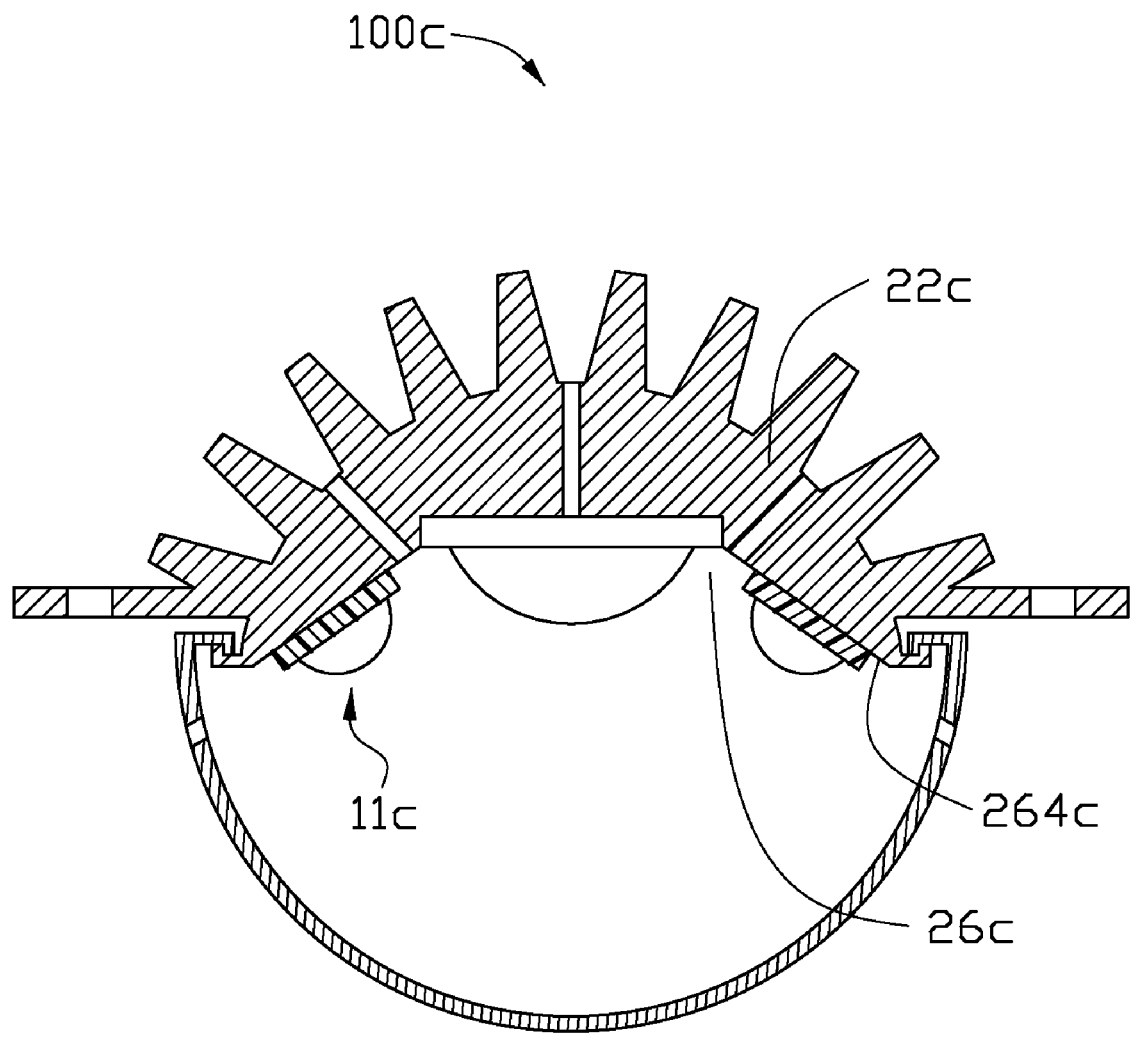
FIG. 9 is a cross-sectional view of a lamp unit of an LED illumination device according to a fourth embodiment.

Referring to FIG. 9, a lamp unit 100c of an LED illumination device according to a fourth embodiment is illustrated. Except the following differences, the lamp unit 100c of the present embodiment is essentially the same as the lamp unit 100 of the previous embodiment. In the present embodiment, the lamp unit 100c further includes a plurality of auxiliary light sources 11c received in an elongated recess 26c defined in a bottom of a base 22c of a heat sink thereof and attached to two sloping second planes 264c of the base 22c to expand the illumination area and illumination capability of the lamp unit 100c. Each of the two sloping second planes 264c of the base 22c functions as a heat-absorbing surface for the auxiliary light sources 11c.

Figure 10:
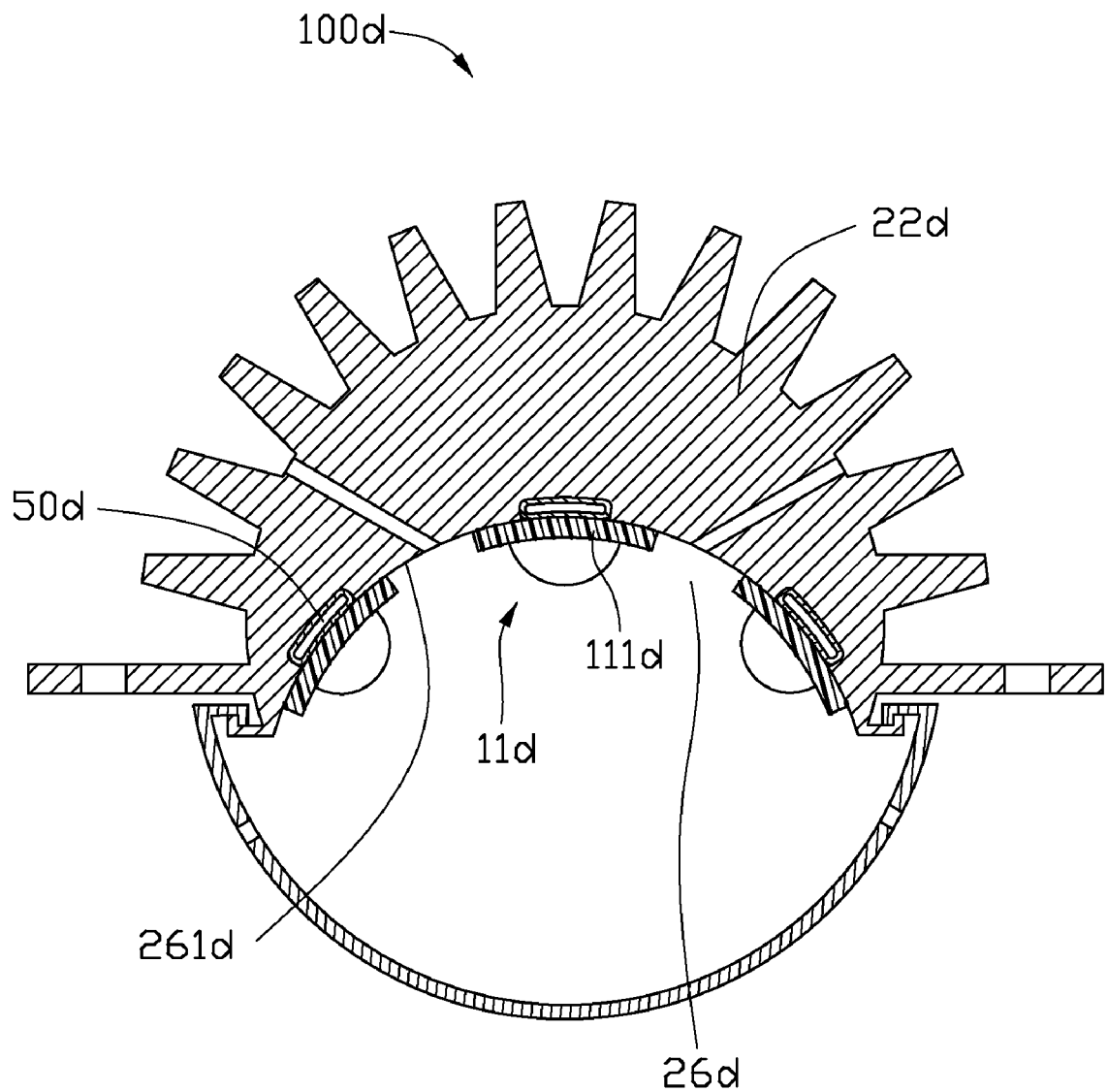
FIG. 10 is a cross-sectional view of a lamp unit of an LED illumination device according to a fifth embodiment.

Referring to FIG. 10, a lamp unit 100d of an LED illumination device according to a fifth embodiment is illustrated. Except the following differences, the lamp unit 100d of the present embodiment is essentially the same as the lamp unit 100 of the previous embodiment. In the present embodiment, a base 22d of a heat sink of the lamp unit 100d forms an arch-shaped concave surface 261d at a bottom side thereof. Light sources 11d are received in an elongated recess 26d defined in the bottom side of the base 22d and attached to the concave surface 261d. A substrate 11d of each light source 11d is arch-shaped corresponding to the concave surface 261d. The light sources 11 are evenly spaced from each other along a transverse direction of the base 22d. The concave surface 261d of the base 22d functions as a heat-absorbing surface for the light sources 11d. The lamp unit 100d further provides a plurality of heat pipes 50d arranged between the base 22d and the light sources 11d.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A lamp unit, comprising:
   a light-emitting module comprising a plurality of light sources; and
   a heat sink arranged above the light-emitting module, the heat sink comparing an elongated base and a plurality of fins formed on the base, the base having an outer substantially convex surface formed at a top side thereof and an opposite inner concave surface formed at a bottom side thereof, the fins extending outwardly from the convex surface of the base, the concave surface defining an elongated recess extending along an axial direction of the base, a light emitting window being defined between two opposite lateral sides of the base and below the concave surface, the light sources being received in the elongated recess of the base and thermally attached to the concave surface, the heat sink defining a plurality of air exchanging holes through the convex surface and the concave surface of the base thereof, heat generated by the light sources being dissipated via the heat sink, light emitted by the light sources being guided to outside via the light emitting window.

2. The lamp unit of claim 1, wherein the concave surface of the base comprises a horizontal first plane at a top thereof and two sloping second planes located below and at two opposite lateral sides of the first plane, the two second planes extending outwardly and downwardly from the two opposite lateral sides of the first plane, respectively, the light sources being arranged on the first plane, the air exchanging holes extending through the second planes.

3. The lamp unit of claim 2, wherein the light-emitting module further comprises a plurality of auxiliary light sources received in the elongated recess of the base and thermally attached to the two second planes.

4. The lamp unit of claim 1, wherein the concave surface is substantially V-shaped and comprises two sloping planes intersecting with each other, the light sources being arranged on the two sloping planes, the air exchanging holes extending through a joint of the two sloping planes.

5. The lamp unit of claim 1, wherein the concave surface is arch-shaped, the light sources being evenly spaced from each other along a transverse direction of the base.

6. The lamp unit of claim 1, wherein each of the light sources comprises a substrate and an LED arranged on the substrate.

7. The lamp unit of claim 1, further comprising at least one flat heat pipe arranged between the base and the light sources and thermally contacting with the light sources.

8. The lamp unit of claim 1, wherein the light-emitting module further comprises a light penetrable cover located below the light sources and mounted to the heat sink, the light penetrable cover defining a plurality of air venting holes therein.

9. The lamp unit of claim 1, wherein the convex surface of the elongated base of the heat sink is substantially semicircular and the fins have a uniform height.

10. An LED illumination device, comprising:
 a lampshade defining a receiving space therein, the lampshade comprising a mounting plate and a sidewall expanding slightly outwardly from a periphery of the mounting plate, the receiving space being cooperatively defined by the mounting plate and the sidewall; and
 at least one lamp unit mounted on the lampshade, comprising:
  a light-emitting module comprising a plurality of light sources; and
  a heat sink arranged above the light-emitting module, the heat sink comprising an elongated base and a plurality of fins formed on the base, the base having an outer convex surface formed at a top side thereof and an opposite inner concave surface formed at a bottom side thereof, the fins extending outwardly from the convex surface of the base, the concave surface defining an elongated recess extending along an axial direction of the base, a light emitting window being defined between two opposite lateral sides of the base and below the concave surface, the light sources being received in the elongated recess of the base and thermally attached to the concave surface, the heat sink defining a plurality of air exchanging holes through the convex surface and the concave surface of the base thereof, heat generated by the light sources being dissipated via the heat sink, light emitted by the light sources radiating to an outside of the LED illumination device through the light emitting window.

11. The LED illumination device of claim 10, wherein the mounting plate of the lampshade defines at least one elongated opening therein, the at least one lamp unit being located in the at least one elongated opening of the lampshade, a pair of mounting flanges extending respectively from the two opposite lateral sides of the base and abutting on the mounting plate to mount the lamp unit of the lampshade in the elongated opening, the light-emitting module of the at least one lamp unit being received at the at least one elongated opening of the lampshade, the fins of the heat sink of the at least one lamp unit being located above the mounting plate of the lampshade.

12. The LED illumination device of claim 10, wherein the air exchanging holes are located adjacent to the light sources and evenly spaced from each other along the base of the heat sink.

13. The LED illumination device of claim 10, wherein the light-emitting module of the at least one lamp unit further comprises a light penetrable cover located below the light sources and mounted to the heat sink, the light penetrable cover defining a plurality of air venting holes therein.

14. The LED illumination device of claim 13, wherein the air venting holes are located adjacent to two opposite lateral sides of the light penetrable cover.

15. The LED illumination device of claim 13, wherein the at least one lamp unit further comprises two end covers mounted to two opposite axial ends of the heat sink, each of the end covers defining a wire hole therein for electrical wires of the light sources extending therethrough.

16. The LED illumination device of claim 13, wherein the light penetrable cover is substantially C-shaped and forms two securing portions at two opposite lateral sides thereof, the two opposite lateral sides of the base forming two brackets thereon for engaging with the securing portions of the light penetrable cover to mount the light penetrable cover on the heat sink.

17. The LED illumination device of claim 10, further comprising an electrical module mounted on the lampshade and electrically connected with the light-emitting module of the at least one lamp unit.

18. The LED illumination device of claim 10, wherein the elongated base of the heat sink is substantially semicircular and the fins have a uniform height.

* * * * *